United States Patent
Yamashiro et al.

(10) Patent No.: US 9,741,453 B2
(45) Date of Patent: Aug. 22, 2017

(54) PROBER CHUCK FOR MAGNETIC MEMORY, AND PROBER FOR MAGNETIC MEMORY PROVIDED WITH SAID CHUCK

(71) Applicant: TOEI SCIENTIFIC INDUSTRIAL CO., LTD., Sendai-shi (JP)

(72) Inventors: Tomokazu Yamashiro, Sendai (JP); Hiroyuki Kenju, Sendai (JP); Ryoichi Utsumi, Sendai (JP); Shigeyuki Sato, Sendai (JP)

(73) Assignee: TOEI SCIENTIFIC INDUSTRIAL CO., LTD., Sendai-shi, Miyagi (JP)

( * ) Notice: Subject to any disclaimer, the term of this patent is extended or adjusted under 35 U.S.C. 154(b) by 49 days.

(21) Appl. No.: 14/765,956

(22) PCT Filed: Feb. 4, 2014

(86) PCT No.: PCT/JP2014/052484
§ 371 (c)(1),
(2) Date: Aug. 5, 2015

(87) PCT Pub. No.: WO2014/123094
PCT Pub. Date: Aug. 14, 2014

(65) Prior Publication Data
US 2016/0012920 A1  Jan. 14, 2016

(30) Foreign Application Priority Data
Feb. 5, 2013 (JP) .................................. 2013-020591

(51) Int. Cl.
*G01R 31/00* (2006.01)
*G11C 29/56* (2006.01)
(Continued)

(52) U.S. Cl.
CPC .... *G11C 29/56016* (2013.01); *G01R 1/06705* (2013.01); *G01R 31/12* (2013.01);
(Continued)

(58) Field of Classification Search
CPC .............. H01J 2237/2446; H01J 37/20; H01J 37/3266; G11C 11/16; G11C 2029/5602;
(Continued)

(56) References Cited

U.S. PATENT DOCUMENTS

| | | | |
|---|---|---|---|
| 5,981,913 A * | 11/1999 | Kadomura | H01L 21/6831 118/724 |
| 8,240,650 B2 * | 8/2012 | Teich | G01R 1/04 165/138 |

(Continued)

FOREIGN PATENT DOCUMENTS

| JP | 2004-101308 A | 4/2004 |
|---|---|---|
| JP | 2008-004730 A | 1/2008 |

OTHER PUBLICATIONS

Office Action issued Jan. 6, 2016 in corresponding KR Application No. 10-2015-7023933.

*Primary Examiner* — Vinh Nguyen
(74) *Attorney, Agent, or Firm* — Knobbe Martens Olson & Bear LLP

(57) ABSTRACT

There is provided a prober chuck capable of carrying out low leakage evaluation on a magnetic memory under environment in which a magnetic field is applied. A prober chuck 1 for a magnetic memory retains a wafer W having a magnetic memory formed thereon. The chuck 1 includes: a chuck top 10 that is made of a conductive material and has a wafer W placed thereon; an insulating layer 11 that is made of an insulating material and is adapted to support the bottom surface of the chuck top 10; and a guard layer 12 that is made of a conductive material and is arranged under the insulating layer 11, the guard layer being insulated from the chuck top 10 via the insulating layer 11. All of the members constituting the chuck 1 including the chuck top 10 and the guard layer 12 are made of a non-magnetic material.

4 Claims, 4 Drawing Sheets

(51) Int. Cl.
*G01R 1/067* (2006.01)
*G01R 31/12* (2006.01)
*G11C 11/16* (2006.01)

(52) U.S. Cl.
CPC .............. *G11C 29/56* (2013.01); *G11C 11/16* (2013.01); *G11C 2029/5602* (2013.01)

(58) Field of Classification Search
CPC .............. G11C 29/56; G11C 29/56016; G01R 1/06705; G01R 31/308; G01R 31/318572; G01R 31/2865
See application file for complete search history.

(56) References Cited

U.S. PATENT DOCUMENTS

2001/0025691 A1* 10/2001 Kanno ................. H01J 37/321
  156/345.28
2002/0118009 A1 8/2002 Hollman et al.

* cited by examiner

PROBER CHUCK FOR MAGNETIC MEMORY, AND PROBER FOR MAGNETIC MEMORY PROVIDED WITH SAID CHUCK

CROSS-REFERENCE TO RELATED APPLICATIONS

This application is the U.S. National Phase under 35. U.S.C. §371 of International Application PCT/JP2014/052484, filed Feb. 4, 2014, which claims priority to Japanese Patent Application No. 2013-020591, filed Feb. 5, 2013. The disclosures of the above-described applications are hereby incorporated by reference in their entirety.

TECHNICAL FIELD

The present invention relates to a prober chuck for a magnetic memory, for retaining a wafer, the chuck being used for electrically inspecting a magnetic memory to be formed on a wafer, and a prober for a magnetic memory provided with the same.

BACKGROUND ART

Setting aside a magnetic memory, a semiconductor device such as an integrated circuit is fabricated such that it is generally formed on a wafer, separated from the wafer, and then, is assembled as an electronic part, followed by packaging. In an inspection process, a probe test is carried out to confirm the operation of each of the devices formed on the wafer before the devices are cut out.

In the probe test, a prober is used. The prober has a prober chuck for retaining a wafer therein and a stage for relatively moving the chuck with respect to a needle in contact with the wafer. First of all, the wafer is placed and retained on the chuck, an electrode of a semiconductor device and a needle are brought into contact with each other by the operation of the stage, an electric signal is supplied from a tester to the device via the needle, and then, a signal output from the device is detected by the tester, thus inspecting whether or not the device is normally operated.

In order to achieve low leakage evaluation, Patent Document 1, for example, discloses, as a low leakage chuck capable of measuring a fine current with high accuracy, a chuck for a prober including a conductive chuck top having a wafer placed thereon, an insulating member for retaining the bottom surface of the conductive chuck top, and a guard layer made of a conductive material such as nickel plating formed on the lower surface of the insulating member. Here, the same potential is applied to both of the conductive chuck top serving as a signal layer in contact with the back surface of the wafer and the guard layer, thus suppressing a leakage current flowing from the signal layer to a ground layer (i.e., an earth), not shown.

PRIOR ART DOCUMENT

Patent Document

Patent Document 1: Japanese Unexamined Patent Application Publication No. 2008-4730

SUMMARY OF THE INVENTION

Problems to be Solved by the Invention

Recently, a magnetic memory has received attention. The magnetic memory is called an MRAM (Magnetoresistive Random Access Memory) or an STT-RAM (Spin Transfer Torque RAM), and is a memory adopting spin electronics that utilizes spinning of an electron as a memory element. The magnetic memory stores data utilizing a difference in a direction in which magnetism is applied to a magnetic layer. Specifically, a magnetic tunnel junction (abbreviated as MTJ) element having two magnetic layers holding an insulating layer therebetween is used as a storage element, wherein one of the two magnetic layers is a fixed layer whose magnetization direction is fixed whereas the other magnetic layer is a variable layer whose magnetization direction is variable, and therefore, the magnetization direction of the variable layer is varied so as to switch a resistance value so that each state corresponds to 0 or 1.

Also in inspecting the operation of the above-described magnetic memory, it is preferable to suppress a leakage current, like the semiconductor device. It is construed that the above-described structure for applying the same potential to the signal layer and the guard layer so as to suppress a leakage current is mounted on a prober chuck in order to suppress a leakage current.

In a probe test for the magnetic memory, in order to forcibly vary the magnetization direction of the variable layer of the magnetic memory to a desired direction required for the test, it is construed that a magnetic field of, for example, 1 T (tesla) is applied to the magnetic memory (i.e., the wafer). In this case, in the conventional prober chuck for a semiconductor device, a magnetic material such as iron has been generally used for the conductive materials constituting the signal layer and the guard layer, a joining member such as a screw, and other metallic members so as to reduce cost and secure strength. In the case where a magnetic field of, for example, 0.1 T (tesla) or higher is applied to the above-described chuck, the chuck inclusive of the magnetic material is physically pulled by a magnetic force, and further, vibrated into a noise source, thereby making the low leakage evaluation difficult.

The present invention has been accomplished to pay attention to the above-described problems. Therefore, an object of the present invention is to provide a prober chuck capable of carrying out low leakage evaluation of a magnetic memory under environment in which a magnetic field is applied, and a prober for a magnetic memory provided with the chuck.

Means for Solving the Problems

The present invention takes the following measures so as to achieve the above-described object.

In other words, according to the present invention, there is provided a prober chuck for a magnetic memory, retaining a wafer having a magnetic memory formed thereon, the prober chuck including a chuck top that is made of a conductive material and has the wafer placed thereon; an insulating layer that is made of an insulating material and is adapted to support the bottom surface of the chuck top; and a guard layer that is made of a conductive material and is arranged under the insulating layer, the guard layer being insulated from the chuck top via the insulating layer, wherein all members constituting the chuck including the chuck top and the guard layer are made of a non-magnetic material.

The non-magnetic member signifies a member that does not exhibit any attractive force or repulsive force in a magnetic field of a predetermined strength such as 1 T (tesla). Examples of a non-magnetic conductive material include gold, aluminum, copper, titanium, and platinum.

Examples of an insulating material include various ceramic materials and various resin materials.

In this manner, all of the members constituting the chuck including the chuck top and the guard layer are made of the non-magnetic members. Therefore, even if the magnetic field is applied to the wafer, the members constituting the chuck do not exhibit an attractive force or a repulsive force in the magnetic field, and therefore, it is possible to prevent any vibrations caused by the application of the magnetic field and achieve the low leakage evaluation. In addition, the chuck top having the wafer placed thereon is made of the conductive material, and further, the conductive guard layer is arranged via the insulating layer under the chuck top. Thus, when the same potential is applied to the chuck top and the guard layer, even if a leakage current appears, its influence can be reduced or eliminated, thereby achieving the low leakage evaluation.

In order to provide the chuck that is further suitable for the low leakage evaluation, it is preferable that the chuck further including: a second insulating layer that is made of an insulating material and is arranged under the guard layer; and a ground layer that is made of a conductive material and is arranged under the second insulating layer, the ground layer being insulated from the guard layer via the second insulating layer.

In order to prevent any influence by a magnetic field and secure strength while fixing each of the layers, it is preferable that the insulating layer and the second insulating layer are formed in a size larger than the guard layer, and further, an area without the guard layer is defined between the insulating layer and the second insulating layer, and a non-magnetic fixing portion for fixing both of the insulating layers to each other is disposed at the area.

Examples of the fixing portion include a fastening tool such as a screw, a bolt, or a nut or an adhesive agent.

In order to avoid an electric influence while pursuing the thinness of the chuck, the fixing portion should be preferably a non-magnetic insulating adhesive agent.

The chuck is suitable for the prober, described later.

In other words, according to the present invention, there is provided a prober for a magnetic memory including: said prober chuck for a magnetic memory; a θXY stage that supports the chuck rotatably on a Z axis and movably along an X axis and a Y axis; a Z stage that can move a needle of a fixed probe card along the Z axis so as to bring the needle into or out of contact with a wafer retained by the chuck; and a magnetic field generator that is arranged under the chuck and allows the chuck to pass therethrough so as to apply a magnetic field to the wafer, wherein the θXY stage is a space stage that has its scaffolding put sideways except for the lower section of the chuck and has a space for disposing the magnetic field generator under the chuck, its operational direction being set such that the position of the Z axis of the chuck is invariable.

A vertical direction is referred to as a Z axis; a certain direction in a horizontal direction is referred to as an X axis; and a direction perpendicular to the X axis in the horizontal direction is referred to as a Y axis.

With this configuration, the distance between the magnetic field generator 30 arranged in the space SP and the wafer W retained by the chuck 1 becomes constant all the time, and therefore, the strength of the magnetic field to be applied to the wafer W by the magnetic field generator 30 can be constant, thus providing the prober 3 suitable for the measurement.

In order to provide the chuck that is more suitable for the low leakage evaluation, it is preferable that the Z stage includes a second guard layer that is made of a non-magnetic conductive material and is arranged above the wafer at the time of inspection.

MODE FOR CARRYING OUT THE INVENTION

A prober chuck 1 for a magnetic memory according to one embodiment of the present invention and a prober 3 provided with the chuck 1 will be explained below with reference to the attached drawings.

Figure 1:
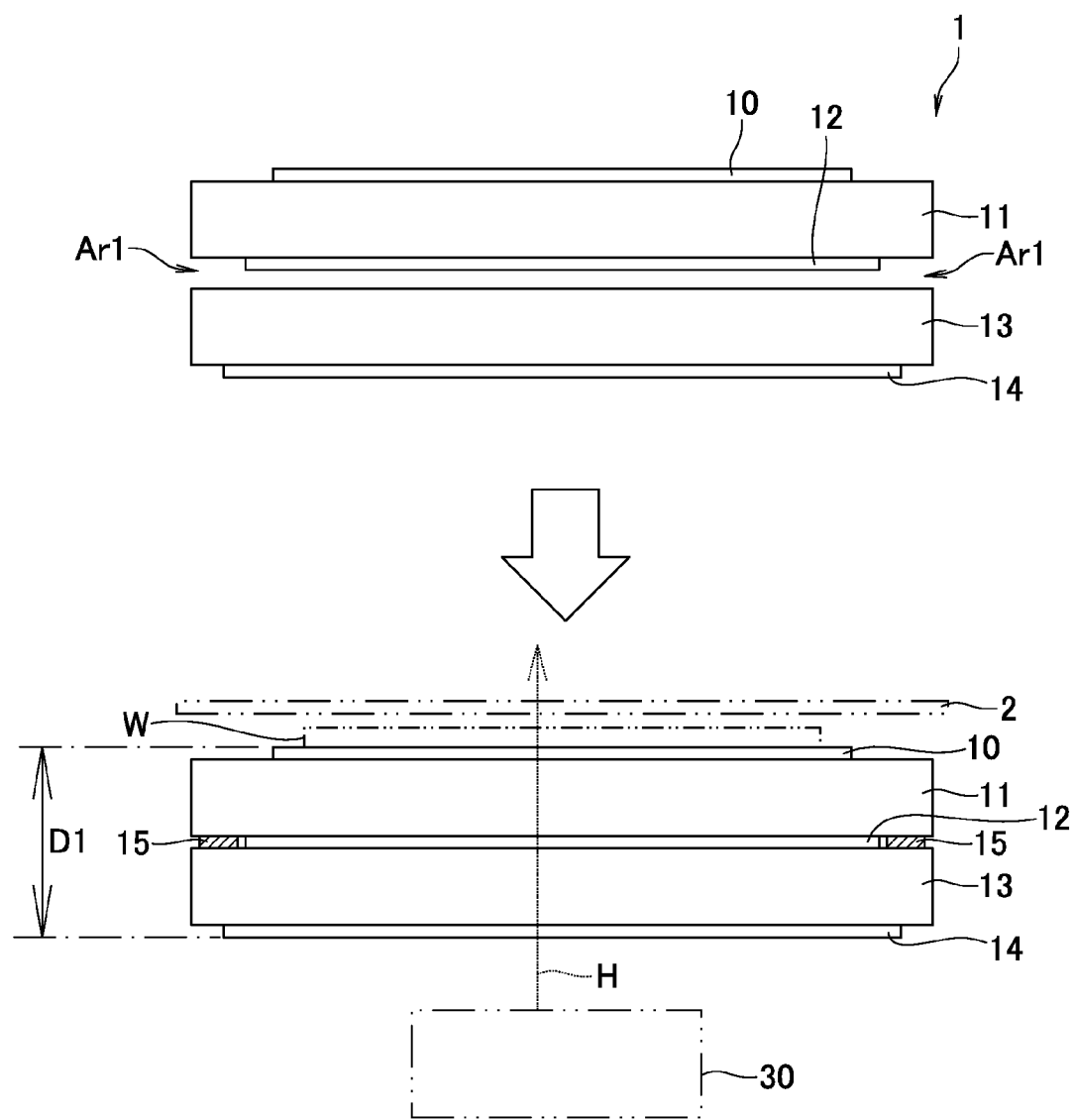
FIG. 1 is a cross-sectional view schematically showing a prober chuck for a magnetic memory according to one embodiment of the present invention.

As shown in FIG. 1, the prober chuck 1 is used for electrically inspecting a magnetic memory formed on a wafer W, and is adapted to retain the wafer W having the magnetic memory formed thereon. The prober chuck 1 includes a chuck top 10 serving as a signal layer, an insulating layer 11, a guard layer 12, a second insulating layer 13, and a ground layer 14, in which the members 10 to 14 each are formed into a disk-like shape and are laminated.

The chuck top 10 is made of a non-magnetic conductive material, and has the wafer W placed thereon. The non-magnetic member signifies a member that does not exhibit an attractive force or a repulsive force in a magnetic field of a predetermined strength such as 1 T (tesla). Moreover, the non-magnetic member also signifies a member that does not influence an outside magnetic field (i.e., an environmental magnetic field). Although gold is used as a material in the present embodiment, other materials can be used as long as the material is a non-magnetic conductive member. Examples of the materials include aluminum, copper, titanium, and platinum. The use of gold is preferred in order to reduce a contact resistance against the wafer W.

The insulating layer 11 is made of a non-magnetic insulating material, and supports the bottom surface of the chuck top 10. Although alumina or ceramic such as silicon nitride is used in the present embodiment, other materials can be used as long as a material is a non-magnetic insulating member. Examples of the materials include various kinds of ceramic materials, various kinds of resin materials, and Peek (a high insulating resistor). Since a considerable load is applied via the wafer in inspecting, it is preferable to use ceramic that is strong even if it is thin. Incidentally, "Peek" is a trademark of Victrex, U.K., and is also called a polyether ether ketone resin.

The guard layer 12 is formed of a non-magnetic conductive material, is arranged under the insulating layer 11, and is insulated from the chuck top 10 via the insulating layer 11. Although gold is used in the present embodiment, the guard layer 12 may be made of a material other than gold as long as it is made of a non-magnetic conductive material, like the chuck top 10.

The second insulating layer 13 is formed of a non-magnetic insulating material, and is arranged under the guard layer 12. In the present embodiment, the second insulating layer 13 is made of the same material as that of the insulating layer 11.

The ground layer 14 is formed of a non-magnetic conductive material, and further, is arranged under the second insulating layer 13, and therefore, is insulated from the guard layer 12 via the second insulating layer 13. Although gold is used in the present embodiment, the guard layer 12 may be made of a material other than gold as long as it is made of a non-magnetic conductive material, like the chuck top 10.

Figure 2A:
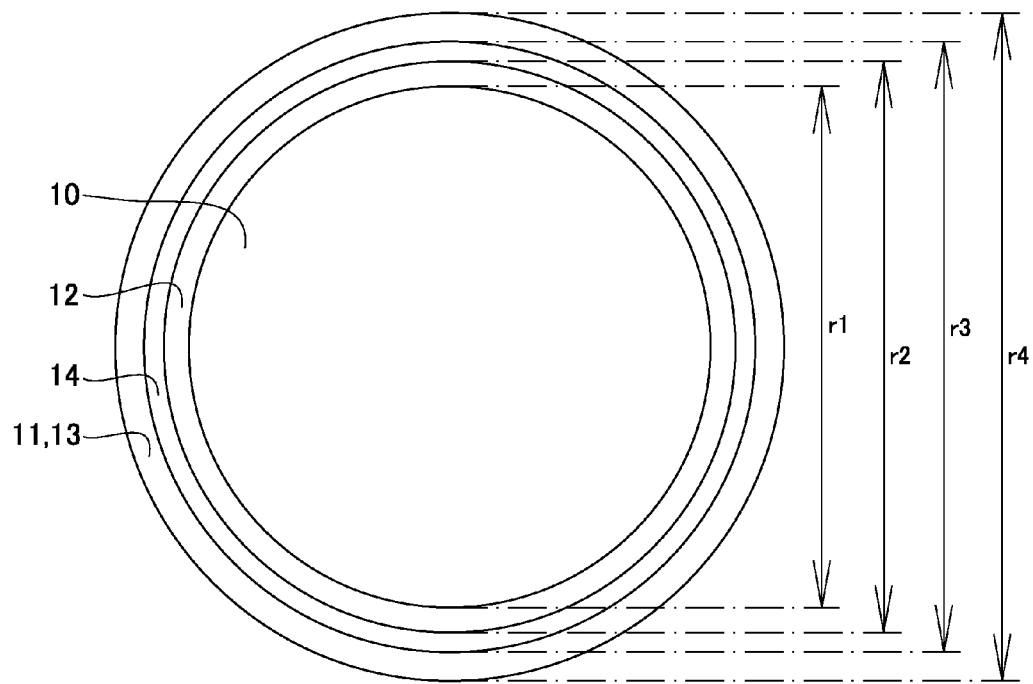
FIG. 2A is a plan view schematically showing the diameter of each of members constituting a chuck.

As shown in FIG. 2A, the diameter R1 of the chuck top 10 is smaller than the diameter R2 of the guard layer 12. Consequently, the chuck top 10 as the signal layer can be electrically protected by the guard layer 12, and becomes more suitable for low leakage evaluation. The diameter R3 of the ground layer 14 may be equal to or greater than the diameter R2 of the guard layer 12. In the present embodiment, the diameter R3 of the ground layer 14 is greater than the diameter R2 of the guard layer 12. Specifically, the diameter R1 of the chuck top 10<the diameter R2 of the guard layer 12<the diameter R3 of the ground layer 14. In this manner, the diameters of all of the conductive layers (i.e., the chuck top 10, the guard layer 12, and the ground layer 14) are different from each other, and therefore, wires are easily drawn. It is to be understood that the diameter R1 of the chuck top 10<the diameter R2 of the guard layer 12 the diameter R3 of the ground layer 14.

Although not shown, the chuck 1 has connecting terminals to be electrically connected to the guard layer 12 and the ground layer 14. Moreover, according to the type of chuck 1, the chuck 1 may have an air hole or a groove formed thereon in order to attract the wafer W.

Figure 3:
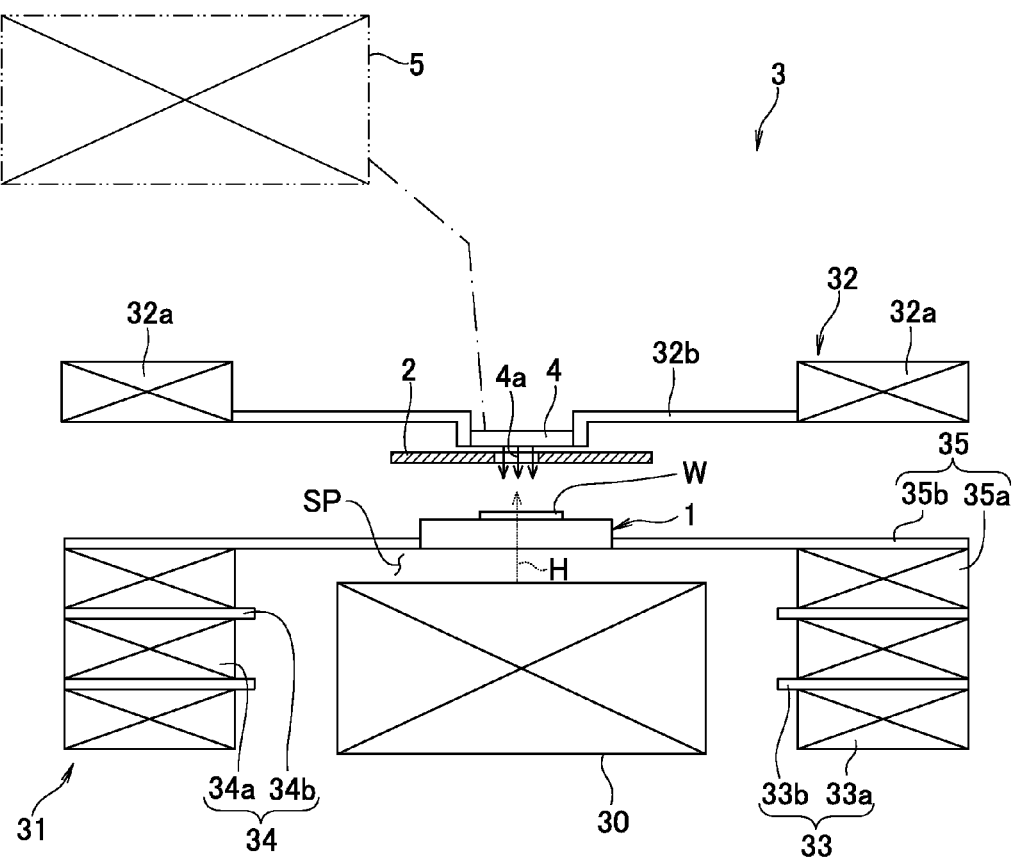
FIG. 3 is a front view schematically showing a prober for a magnetic memory according to the embodiment.

FIG. 3 is a front view schematically showing the prober 3 provided with the prober chuck 1. At the time of a probe test, a probe card 4 for bringing a needle 4a into contact with a magnetic memory placed on the wafer W so as to carry out electric inspection is arranged in a space defined above the chuck 1, and therefore, a magnetic field generator 30 such as an electromagnet is arranged under the chuck 1. As shown in FIG. 1, since the attenuation of the strength of a magnetic field H is reduced as the chuck becomes thinner, the chuck 1 should be preferably as thin as possible such that the magnetic field H is applied to the wafer W through the chuck 1 from the magnetic field generator 30. If the chuck 1 is thick, the strong electromagnet 30 is necessary, and therefore, the electromagnet unfavorably becomes enlarged. As described above, means for fixing the members constituting the chuck 1 is necessary in order to fabricate the chuck 1 having a multi-layered structure.

In view of the above, in the present embodiment, in order to form the thin chuck 1, the chuck top 10, the guard layer 12, and the ground layer 14 are formed on the insulating materials by plating with gold. In general, in order to apply gold plating to an insulating material, a magnetic conductive material such as nickel is used as a base. However, no magnetic material can be used, and therefore, copper, for example, as a non-magnetic member is used as a base. Here, it is to be understood that plating is effective without using any base. For example, roughening the surface of an insulating material enables plating. Alternatively, a dry process such as sputtering or vacuum deposition exemplifies means for thinly forming a conductive material on an insulating material. In the dry process, aluminum, titanium, platinum, or the like can be used as a base.

In the present embodiment, the chuck top 10 is formed at the upper surface of the insulating layer 11 whereas the guard layer 12 is formed at the lower surface of the insulating layer 11 by applying gold plating without any base. Moreover, the ground layer 14 is formed at the lower surface of the second insulating layer 13. Alternatively, the guard layer 12 may be formed at the upper surface of the second insulating layer 13.

As shown in FIG. 2A, the diameter R4 of each of the insulating layer 11 and the second insulating layer 13 is set to be greater than the diameter R2 of the guard layer 12. Consequently, as shown in FIG. 1, an area Ar1 without any guard layer 12 is defined between the insulating layer 11 and the second insulating layer 13. In order to fix the insulating layer 11 and the second insulating layer 13, a non-magnetic fixing portion 15 for fixing the insulating layers 11 and 12 to each other is disposed at the area Ar1. Specifically, the fixing portion 15 is a non-magnetic insulating adhesive agent. Although in the present embodiment, an epoxy-based adhesive agent is used as the fixing portion 15, it is not limited to this. Here, the reason why the insulating material is used as the adhesive agent is that the adhesive agent permeates the insulating layer 11 and the second insulating layer 13 to some extent. The use of a conductive material unfavorably reduces the insulating function of these insulating layers. Incidentally, although the fixing portion 15 in the present embodiment is the adhesive agent, a non-magnetic fastening tool such as a screw, a bolt, a nut, or a clamp mechanism may be used.

As shown in FIG. 1, the thickness D1 of the chuck 1 including the chuck top 10, the insulating layer 11, the guard layer 12, the second insulating layer 13, and the ground layer 14 is set to about 4 mm in the present embodiment. In order to apply a sufficiently strong magnetic field to the wafer W while avoiding the large size of the magnetic field generator 30, the thickness D1 should be preferably about 5 mm or less. If the thickness D1 becomes greater than about 5 mm, the size of the electromagnet (i.e., the magnetic field generator 30) is unfavorably enlarged. Specifically, the thickness of each of the insulating layer 11 and the second insulating layer 13 is about 2 mm or less, and the thickness of each of the chuck top 10, the guard layer 12, and the ground layer 14 is about 20 μm or less. In general, the thicker the insulating material, the higher the insulating effect. Therefore, in a chuck used for inspecting a general semiconductor device such as an integrated circuit, the insulating layer is thickened in order to enhance the insulating effect. Normally, the thickness of the chuck is set to at least 10 mm or more.

Next, the prober 3 provided with the prober chuck 1 will be explained with reference to FIG. 3. Here, in the present specification, a vertical direction is referred to as a Z axis; a certain horizontal direction, as an X axis; and a direction perpendicular to the X axis in the horizontal direction, as a Y axis.

The prober 3 for a magnetic memory includes the prober chuck 1, a θXY stage 31, a Z stage 32, and the magnetic field generator 30.

The θXY stage 31 supports the chuck 1 rotatably on the Z axis and movably along the X and Y axes. The θXY stage 31 has its scaffolding put sideways except for the lower section of the chuck 1. As a result, a space SP for arranging the magnetic field generator 30 functions as a space stage formed in the lower section of the chuck 1. The operational direction of the θXY stage 31 is set such that the position of the Z axis of the chuck 1 is invariable. The θXY stage 31 includes a Y stage 33, an X stage 34, and a θ stage 35.

Specifically, as shown in FIG. 3, the Y stage 33 is disposed with respect to a casing, not shown. The Y stage 33 includes a pair of Y rail portions 33a disposed as scaffolding and a Y stage body 33b supported by both of the Y rail portions 33a movably along the Y axis. The Y stage body 33b is formed into a plate-like shape and is supported at the end thereof by the Y rail portions 33a. A hole is formed at the center of the Y stage body 33b so as to dispose the magnetic field generator 30.

The X stage 34 is mounted on the Y stage body 33b. The X stage 34 includes a pair of X rail portions 34a disposed as scaffolding and an X stage body 34b supported by both of the X rail portions 34a movably along the X axis. The X stage body 34b is formed into a plate-like shape and is supported at the end thereof by the X rail portions 34a. A hole is formed at the center of the X stage body 34b so as to dispose the magnetic field generator 30.

The θ stage 35 is mounted on the X stage body 34b. The θ stage 35 includes annular θ rail portions 35a disposed as scaffolding and a θ stage body 35b supported by the θ rail portions 35a rotatably on the Z axis. The θ stage body 35b is formed into a plate-like shape and is supported at the end thereof by the θ rail portions 35a. A hole is formed at the center of the θ stage body 35b. A chuck retainer, not shown, for retaining the prober chuck 1 is disposed at the peripheral edge of the hole.

In this manner, the scaffolding (33a, 34a, and 35a) is put sideways except for the lower section of the chuck 1, and the plate-like stage bodies (33b, 34b, and 35b) are stretched across the scaffolding. As a consequence, the θXY stage 31 constitutes the space stage having the space SP for arranging the magnetic field generator 30 under the chuck 1. Moreover, the operational directions of the stages 33, 34, and 35 are only the linear operation along the X axis, the linear operation along the Y axis, and the rotation on the Z axis, and thus, the position of the Z axis of the chuck 1 is invariable.

Figure 2B:
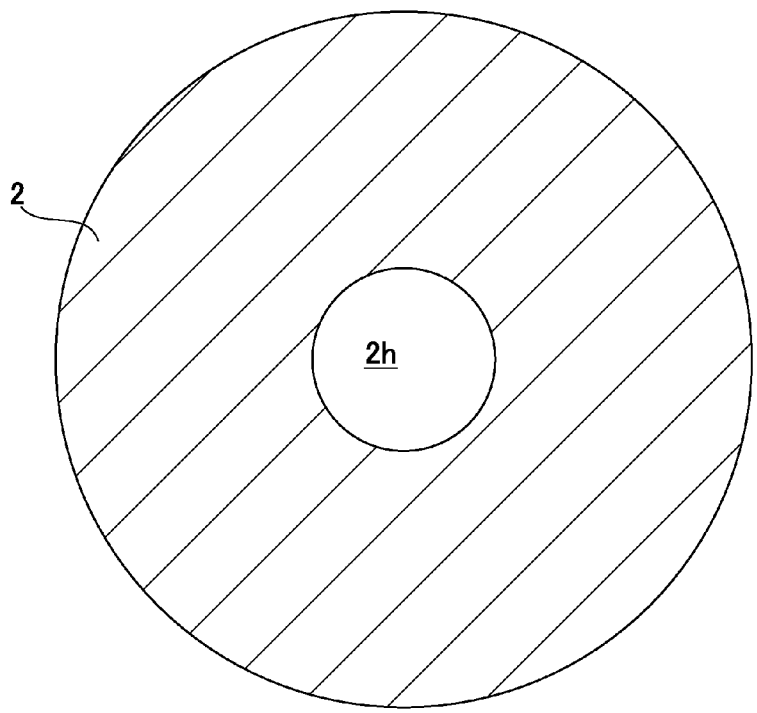
FIG. 2B is a plan view schematically showing a second guard layer.

The probe card 4 can be fixed to the Z stage 32. When the needle 4a of the fixed probe card 4 is moved along the Z axis, the needle 4a can be brought into or out of contact with the wafer W retained by the chuck 1. Specifically, the Z stage 32 includes a plate-like Z stage body 32b having the probe card 4 fixed thereto and a Z supporter 32a for movably supporting the Z stage body 32b at a casing, not shown, as scaffolding along the Z axis. The Z stage 32 includes a second guard layer 2 that is formed of a non-magnetic conductive material and is arranged above the wafer W at the time of inspection. As shown in FIG. 2B, a hole 2h for allowing the needle 4a of the probe card 4 to pass therethrough is formed at the center of the second guard layer 2.

As shown in FIG. 3, the magnetic field generator 30 is arranged under the chuck 1, so as to apply the magnetic field H to the wafer W through the chuck 1 (see FIG. 1). In the present embodiment, a magnetic device of a perpendicular magnetic film is to be inspected, and therefore, the electromagnet for applying a perpendicular magnetic field functions as the magnetic field generator 30. However, an electromagnet for applying an in-planar magnetic field may be used according to a magnetic memory. The magnetic field generator 30 is located close to the bottom surface of the chuck 1, and is separated by, for example, about 1 mm. Here, although the electromagnet should be preferred as the magnetic field generator 30, a permanent magnet may be used in some cases.

As shown in FIG. 1, at the time of the probe test, a tester 5 and the probe card 4 are connected to each other. The same potential is applied to the signal layer (i.e., the chuck top 10), the guard layer 12, and the second guard layer 2, and further, the ground layer 14 is grounded. The magnetic field generator 30 applies a magnetic field of about 1 T (tesla) to the wafer W. The prober 3 controls the driving of the stages 32 to 35 such that the needle 4a is brought into contact with a magnetic memory to be inspected. The inspection is carried out in the state in which the predetermined magnetic field is applied to the wafer W.

As described above, the prober chuck 1 in the present embodiment for a magnetic memory, retaining a wafer W having a magnetic memory formed thereon, the prober chuck 1 including: a chuck top 10 that is made of a conductive material and has the wafer W placed thereon; an insulating layer 11 that is made of an insulating material and is adapted to support the bottom surface of the chuck top 10; and a guard layer 12 that is made of a conductive material and is arranged under the insulating layer 11, the guard layer 12 being insulated from the chuck top 10 via the insulating layer 11, wherein all members constituting the chuck 1 including the chuck top 10 and the guard layer 12 are made of a non-magnetic material.

In this manner, all of the members constituting the chuck 1 including the chuck top 10 and the guard layer 12 are made of the non-magnetic members. Therefore, even if the magnetic field is applied to the wafer W, the members constituting the chuck 1 do not exhibit an attractive force or a repulsive force in the magnetic field, and therefore, it is possible to prevent any vibrations caused by the application of the magnetic field and achieve the low leakage evaluation. In addition, the chuck top 10 having the wafer W placed thereon is made of the conductive material, and further, the conductive guard layer 12 is arranged via the insulating layer 11 under the chuck top 10. Thus, when the same potential is applied to the chuck top 10 and the guard layer 12, even if a leakage current appears, its influence can be reduced or eliminated, thereby achieving the low leakage evaluation.

In particular, in the present embodiment, the chuck 1 further including: a second insulating layer 13 that is made of an insulating material and is arranged under the guard layer 12; and a ground layer 14 that is made of a conductive material and is arranged under the second insulating layer 13, the ground layer 12 being insulated from the guard layer 12 via the second insulating layer 13.

With this configuration, since the ground layer 14 is disposed in the chuck 1, when the ground layer 14 is grounded, disturbance noise can be prevented by the chuck 1. Thus, it is possible to provide the chuck that is further suitable for the low leakage evaluation.

In fabricating the chuck having the above-described configuration, in order to suppress the attenuation of the magnetic field, the chuck should be as thin as possible. In order to fabricate the chuck having the multi-layered structure, the means for fixing the layers is necessary. In view of this, in the present embodiment, the insulating layer and the second insulating layer are formed in a size larger than the guard layer, and further, an area without the guard layer is defined between the insulating layer and the second insulating layer, and a non-magnetic fixing portion for fixing both of the insulating layers to each other is disposed at the area.

With this configuration, the non-magnetic fixing portion 15 fixes the insulating layer 11 and the second insulating layer 13, and therefore, the fixing portion 15 does not exhibit the attractive force or the repulsive force in the magnetic field, thereby achieving the low leakage evaluation. Even so, the fixing portion 15 is brought into secure contact with the insulating layer and the second insulating layer at the area Ar1 without any guard layer 12, thus securing the strength.

Although both of the insulating layers 11 and 13 can be fixed to the fixing portion 15 via a fastening tool such as a screw, a bolt, a nut, or a clamp mechanism, the insulating layers 11 and 13 need a certain thickness. In view of this, in the present embodiment, the non-magnetic insulating adhesive agent is used as the fixing portion. With this configuration, even if the chuck is thinned, both of the insulating layers 11 and 13 can be accurately fixed. Moreover, the adhesive agent is made of an insulating material, and therefore, the adhesive agent does not bring any electric influence. Thus, it is possible to pursue the thinness of the chuck having the above-described configuration.

The chuck 1 in the present embodiment should be preferably applied to the prober 3, described later. Specifically, the prober 3 in the present embodiment for a magnetic memory comprising: the prober chuck 1 for a magnetic memory; a θXY stage 31 that supports the chuck 1 rotatably on a Z axis and movably along an X axis and a Y axis; a Z stage 32 that can move a needle 4a of a fixed probe card 4 along the Z axis so as to bring the needle 4a into or out of contact with a wafer W retained by the chuck 1; and a magnetic field generator 30 that is arranged under the chuck 1 and allows the chuck 1 to pass therethrough so as to apply a magnetic field to the wafer W, wherein the θXY stage 31 is a space stage that has its scaffolding (33a, 34a, and 35a) put sideways except for the lower section of the chuck 1 and has a space SP for disposing the magnetic field generator 30 under the chuck 1, its operational direction being set such that the position of the Z axis of the chuck 1 is invariable.

With this configuration, the distance between the magnetic field generator 30 arranged in the space SP and the wafer W retained by the chuck 1 becomes constant all the time, and therefore, the strength of the magnetic field to be applied to the wafer W by the magnetic field generator 30 can be constant, thus providing the prober 3 suitable for the measurement.

Furthermore, in the present embodiment, the Z stage 32 includes a second guard layer 2 that is made of a non-magnetic conductive material and is arranged above the wafer W at the time of inspection.

With this configuration, the positional relationship in which the guard layer 12 and the second guard layer 2 hold the wafer W therebetween is achieved. Therefore, the same potential is applied to both of the guard layers 12 and 2, thus reducing a leakage current from an air layer and noise. Consequently, it is possible to provide the chuck that is more suitable for the low leakage evaluation.

Although the embodiment according to the present invention has been explained above with reference the attached drawings, it should be construed that the specific configuration is not limited to the embodiment. The scope of the present invention should be given not only by the description of the embodiment but also the scope of claims, and further, the significance equal to the scope of claims and all variations within the scope.

Other Embodiments

Although, for example, the second guard layer 2 is disposed on the Z stage of the prober 3 in the present embodiment, as shown in FIG. 3, the second guard layer 2 may be omitted.

Figure 4:
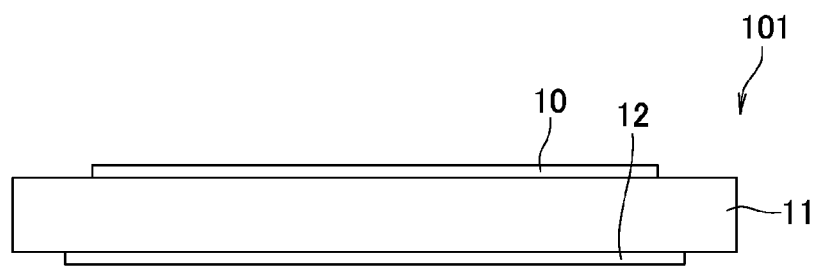
FIG. 4 is a view schematically showing a chuck and a prober provided with the chuck according to an embodiment other than the above-described embodiment of the present invention.
Figure 4:
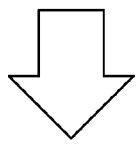
Figure 4:
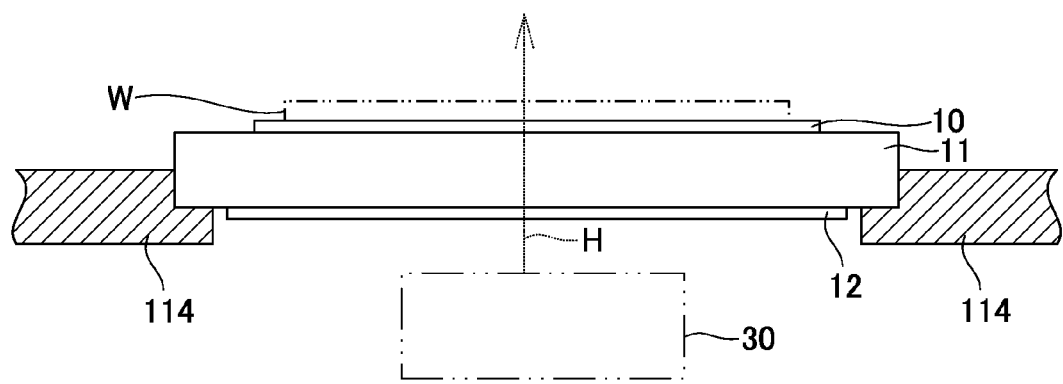

Although the ground layer 14 is integrally incorporated into the chuck 1 in the present embodiment, as shown in FIG. 1, a ground layer 114 may not be incorporated in a chuck 101 but may be disposed at a prober 103, as shown in FIG. 4.

The structure adopted in each of the above-described embodiments may be adopted in any embodiments. The specific configuration of each of the members is not limited only to those of the above-described embodiments, and therefore, various alterations may be achieved without departing from the subject matter of the present invention.

DESCRIPTION OF REFERENCE SIGNS

W . . . wafer
1 . . . prober chuck
10 . . . chuck top
11 . . . insulating layer
12 . . . guard layer
13 . . . second insulating layer
14 . . . ground layer
15 . . . fixing portion (adhesive agent)
3 . . . prober
31 . . . θXY stage
32 . . . Z stage
30 . . . magnetic field generator (electromagnet)

What is claimed is:

1. A prober chuck for a magnetic memory, retaining a wafer having a magnetic memory formed thereon, the prober chuck comprising:
    a chuck top that is made of a conductive material and has the wafer placed thereon;
    an insulating layer that is made of an insulating material and is adapted to support the bottom surface of the chuck top;
    a guard layer that is made of a conductive material and is arranged under the insulating layer, the guard layer being insulated from the chuck top via the insulating layer,
    a second insulating layer that is made of an insulating material and is arranged under the guard layer; and
    a ground layer that is made of a conductive material and is arranged under the second insulating layer, the ground layer being insulated from the guard layer via the second insulating layer
    wherein the chuck top and the guard layer are made of a non-magnetic material, and
    the insulating layer and the second insulating layer are formed in a size larger than the guard layer, and further, an area without the guard layer is defined between the insulating layer and the second insulating layer, and a non-magnetic fixing portion for fixing both of the insulating layers to each other is disposed at the area.

2. The prober chuck for a magnetic memory according to claim 1, wherein the fixing portion is a non-magnetic insulating adhesive agent.

3. A prober for a magnetic memory comprising:
    a prober chuck for a magnetic memory, retaining a wafer having a magnetic memory formed thereon, the prober chuck comprising:
        a chuck top that is made of a conductive material and has the wafer placed thereon;
        an insulating layer that is made of an insulating material and is adapted to support the bottom surface of the chuck top; and
        a guard layer that is made of a conductive material and is arranged under the insulating layer, the guard layer being insulated from the chuck top via the insulating layer, wherein the chuck top and the guard layer are made of a non-magnetic material
a θXY stage that supports the chuck rotatably on a Z axis and movably along an X axis and a Y axis;
a Z stage that can move a needle of a fixed probe card along the Z axis so as to bring the needle into or out of contact with a wafer retained by the chuck; and
a magnetic field generator that is arranged under the chuck and allows the chuck to pass therethrough so as to apply a magnetic field to the wafer,
wherein the θXY stage is a space stage that has its scaffolding put sideways except for the lower section of the chuck and has a space for disposing the magnetic field generator under the chuck, an operational direction of the θXY stage being set such that the position of the Z axis of the chuck is invariable.

4. The prober for a magnetic memory according to claim 3, wherein the Z stage includes a second guard layer that is made of a non-magnetic conductive material and is arranged above the wafer at the time of inspection.

* * * * *